United States Patent
Lee et al.

(10) Patent No.: US 10,559,660 B2
(45) Date of Patent: Feb. 11, 2020

(54) SEMICONDUCTOR DEVICE INCLUDING METAL-2 DIMENSIONAL MATERIAL-SEMICONDUCTOR CONTACT

(71) Applicant: Samsung Electronics Co., Ltd., Suwon-si, Gyeonggi-do (KR)

(72) Inventors: Minhyun Lee, Yongin-si (KR); Haeryong Kim, Seongnam-si (KR); Hyeonjin Shin, Suwon-si (KR); Seunggeol Nam, Suwon-si (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/248,945

(22) Filed: Jan. 16, 2019

(65) Prior Publication Data

US 2019/0148493 A1 May 16, 2019

Related U.S. Application Data

(63) Continuation of application No. 15/010,807, filed on Jan. 29, 2016, now Pat. No. 10,217,819.

(30) Foreign Application Priority Data

May 20, 2015 (KR) .................. 10-2015-0070567
Aug. 4, 2015 (KR) .................. 10-2015-0110233

(51) Int. Cl.
*H01L 29/04* (2006.01)
*H01L 29/78* (2006.01)
(Continued)

(52) U.S. Cl.
CPC ..... *H01L 29/0847* (2013.01); *H01L 21/28512* (2013.01); *H01L 29/04* (2013.01);
(Continued)

(58) Field of Classification Search
CPC ....... H01L 29/66575–66598; H01L 29/66643; H01L 29/0843–0891; H01L 29/41725;
(Continued)

(56) References Cited

U.S. PATENT DOCUMENTS 7,067,867 B2   6/2006   Duan et al.
7,381,586 B2   6/2008   Cheng et al.
(Continued)

FOREIGN PATENT DOCUMENTS

EP       2339638 A1    6/2011
KR   2005-0107591 A   11/2005
(Continued)

OTHER PUBLICATIONS

Jong Woo Shin, "Contact resistance of graphene-metal interface for high performance graphene transistor", KAIST, Department of Electrical Engineering (2014).
(Continued)

*Primary Examiner* — Maliheh Malek
(74) *Attorney, Agent, or Firm* — Harness, Dickey & Pierce, P.L.C.

(57) ABSTRACT

A semiconductor device includes a semiconductor layer, a metal layer electrically contacting the semiconductor layer, and a two-dimensional material layer between the semiconductor layer and the metal layer and having a two-dimensional crystal structure.

14 Claims, 8 Drawing Sheets

(51) Int. Cl.

| | |
|---|---|
| *H01L 29/08* | (2006.01) |
| *H01L 21/285* | (2006.01) |
| *H01L 29/45* | (2006.01) |
| *H01L 29/417* | (2006.01) |
| *H01L 29/06* | (2006.01) |
| *H01L 29/267* | (2006.01) |
| *H01L 29/12* | (2006.01) |
| *H01L 29/26* | (2006.01) |
| *H01L 29/16* | (2006.01) |
| *H01L 29/165* | (2006.01) |

(52) U.S. Cl.
CPC ...... *H01L 29/0665* (2013.01); *H01L 29/0669* (2013.01); *H01L 29/267* (2013.01); *H01L 29/41725* (2013.01); *H01L 29/45* (2013.01); *H01L 29/78* (2013.01); *H01L 29/165* (2013.01); *H01L 29/1606* (2013.01)

(58) Field of Classification Search
CPC ........... H01L 29/41733; H01L 29/4175; H01L 29/41758; H01L 2924/13088; H01L 29/0665–0669; H01L 29/1606; H01L 29/66015; H01L 29/0847; H01L 29/78; H01L 29/04; H01L 29/045
See application file for complete search history.

(56) References Cited

U.S. PATENT DOCUMENTS

| | | | |
|---|---|---|---|
| 7,746,418 B2 | 6/2010 | Wakita | |
| 8,063,451 B2 | 11/2011 | Zhang et al. | |
| 8,076,204 B2* | 12/2011 | Anderson | H01L 29/1606 257/328 |
| 8,089,152 B2 | 1/2012 | Miller | |
| 8,106,383 B2 | 1/2012 | Jenkins et al. | |
| 8,183,566 B2 | 5/2012 | Kobayashi et al. | |
| 8,198,653 B2 | 6/2012 | Imada et al. | |
| 8,361,853 B2 | 1/2013 | Cohen et al. | |
| 8,642,996 B2 | 2/2014 | Cohen et al. | |
| 8,735,941 B2* | 5/2014 | Park | H01L 29/41766 257/194 |
| 8,890,271 B2 | 11/2014 | Tut et al. | |
| 8,962,408 B2 | 2/2015 | Cao et al. | |
| 9,053,932 B2 | 6/2015 | Lee et al. | |
| 9,252,704 B2 | 2/2016 | Nayfeh et al. | |
| 9,546,995 B2 | 1/2017 | Jeon et al. | |
| 9,647,012 B1 | 5/2017 | Liang | |
| 9,691,853 B2* | 6/2017 | Heo | H01L 29/1033 |
| 9,735,233 B2* | 8/2017 | Heo | H01L 29/0665 |
| 9,857,328 B2 | 1/2018 | Hoffman | |
| 9,887,361 B2 | 2/2018 | Bol et al. | |
| 9,893,155 B2 | 2/2018 | Shah | |
| 9,935,184 B2* | 4/2018 | Byun | H01L 29/66977 |
| 9,972,537 B2* | 5/2018 | Jacob | H01L 21/02447 |
| 2004/0188765 A1 | 9/2004 | Narasimha et al. | |
| 2005/0056826 A1 | 3/2005 | Appenzeller et al. | |
| 2005/0263795 A1 | 12/2005 | Choi et al. | |
| 2006/0017106 A1 | 1/2006 | Suh et al. | |
| 2006/0226424 A1 | 10/2006 | Chae et al. | |
| 2007/0072335 A1 | 3/2007 | Baik et al. | |
| 2007/0235714 A1* | 10/2007 | Kwon | C23C 16/045 257/9 |
| 2007/0275530 A1 | 11/2007 | Hung et al. | |
| 2007/0290280 A1 | 12/2007 | Kwon et al. | |
| 2008/0001176 A1 | 1/2008 | Gopalakrishnan et al. | |
| 2008/0042120 A1 | 2/2008 | Shibata et al. | |
| 2008/0138940 A1 | 6/2008 | Lee et al. | |
| 2009/0283822 A1 | 11/2009 | Hsieh et al. | |
| 2010/0117163 A1* | 5/2010 | Miyashita | H01L 21/3105 257/408 |
| 2010/0127269 A1* | 5/2010 | Daniel | H01L 29/1606 257/66 |
| 2010/0200755 A1* | 8/2010 | Kawano | H01L 31/09 250/338.4 |
| 2010/0200840 A1* | 8/2010 | Anderson | H01L 29/1606 257/29 |
| 2010/0230821 A1* | 9/2010 | Madakasira | B82Y 10/00 257/773 |
| 2011/0057163 A1* | 3/2011 | Liu | B82Y 10/00 257/9 |
| 2011/0121264 A1* | 5/2011 | Choi | B82Y 10/00 257/14 |
| 2011/0309372 A1 | 12/2011 | Xin et al. | |
| 2012/0058350 A1* | 3/2012 | Long | B82Y 10/00 428/446 |
| 2012/0085991 A1 | 4/2012 | Cohen et al. | |
| 2012/0112250 A1* | 5/2012 | Chung | H01L 29/1606 257/288 |
| 2012/0235118 A1 | 9/2012 | Avouris et al. | |
| 2013/0032777 A1 | 2/2013 | Yin et al. | |
| 2013/0032794 A1 | 2/2013 | Lee et al. | |
| 2013/0075700 A1 | 3/2013 | Yang et al. | |
| 2013/0130037 A1 | 5/2013 | Bol et al. | |
| 2013/0285019 A1* | 10/2013 | Kim | H01L 29/775 257/29 |
| 2014/0001151 A1* | 1/2014 | Tzeng | B82Y 30/00 216/36 |
| 2014/0008661 A1* | 1/2014 | Iwami | H01L 29/2003 257/76 |
| 2014/0042390 A1* | 2/2014 | Gruner | H01M 4/364 257/14 |
| 2014/0158989 A1 | 6/2014 | Byun et al. | |
| 2014/0191400 A1* | 7/2014 | Chien | H01L 23/53233 257/751 |
| 2014/0225066 A1 | 8/2014 | Weber et al. | |
| 2014/0239257 A1* | 8/2014 | Moon | H01L 29/78684 257/29 |
| 2014/0252436 A1* | 9/2014 | Suwa | H01L 29/78 257/288 |
| 2014/0284547 A1* | 9/2014 | Dimitrakopoulos | H01L 29/0673 257/9 |
| 2014/0299841 A1* | 10/2014 | Nourbakhsh | H01L 29/775 257/29 |
| 2014/0306184 A1* | 10/2014 | Ruhl | H01L 29/1606 257/29 |
| 2014/0306271 A1* | 10/2014 | Wu | H01L 29/78 257/288 |
| 2014/0319452 A1* | 10/2014 | Seabaugh | H01L 29/1606 257/9 |
| 2014/0326989 A1* | 11/2014 | Zan | H01L 29/78696 257/43 |
| 2015/0041854 A1 | 2/2015 | Wang et al. | |
| 2015/0091747 A1* | 4/2015 | Watanabe | H01L 29/785 341/173 |
| 2015/0155374 A1 | 6/2015 | Byun et al. | |
| 2015/0236284 A1* | 8/2015 | Chan | H01L 51/0562 365/182 |
| 2015/0303315 A1* | 10/2015 | Das | H01L 29/78681 257/347 |
| 2015/0357504 A1* | 12/2015 | Chen | H01L 31/028 257/27 |
| 2015/0364589 A1* | 12/2015 | Lee | H01L 29/7839 257/29 |
| 2016/0056301 A1* | 2/2016 | Lee | H01L 29/792 365/185.29 |
| 2016/0087042 A1* | 3/2016 | Lee | H01L 29/1606 257/29 |
| 2016/0190244 A1* | 6/2016 | Lee | H01L 29/778 257/29 |
| 2016/0190321 A1 | 6/2016 | Wang et al. | |
| 2016/0204224 A1* | 7/2016 | Fukui | B82Y 10/00 438/198 |
| 2016/0284704 A1 | 9/2016 | Moroz | G06F 17/5072 |
| 2016/0314968 A1* | 10/2016 | Kim | C23C 16/305 |
| 2017/0018626 A1* | 1/2017 | Hoffman | H01L 29/66045 |
| 2017/0040443 A1* | 2/2017 | Lemaitre | B82Y 10/00 |
| 2017/0053908 A1* | 2/2017 | Hoffman | H01L 27/085 |

(56) References Cited

U.S. PATENT DOCUMENTS

| | | | |
|---|---|---|---|
| 2017/0059514 A1* | 3/2017 | Hoffman | G01N 33/5438 |
| 2017/0092592 A1* | 3/2017 | Shin | H01L 23/53276 |
| 2017/0098693 A1* | 4/2017 | Lin | H01L 29/78684 |
| 2017/0117367 A1* | 4/2017 | Engel | H01L 29/1606 |
| 2017/0140821 A1* | 5/2017 | Mazed | G11C 13/047 |
| 2017/0141194 A1* | 5/2017 | Shah | H01L 29/267 |
| 2017/0162654 A1* | 6/2017 | Maeda | H01L 29/04 |
| 2017/0168612 A1* | 6/2017 | Lee | G06F 3/044 |
| 2017/0170012 A1* | 6/2017 | Ko | H01L 21/02527 |
| 2017/0179263 A1* | 6/2017 | Pourtois | H01L 29/78648 |
| 2017/0218442 A1* | 8/2017 | van Rooyen | G01N 27/414 |
| 2017/0236968 A1* | 8/2017 | Heo | H01L 31/109 257/77 |
| 2017/0236988 A1 | 8/2017 | Heo et al. | |
| 2017/0261465 A1* | 9/2017 | Balijepalli, IV | G01N 27/4148 |
| 2018/0013012 A1* | 1/2018 | Chen | H01L 21/32051 |
| 2018/0108747 A1* | 4/2018 | Van Dal | H01L 29/42392 |
| 2018/0114839 A1* | 4/2018 | Wu | H01L 29/045 |
| 2018/0151751 A1* | 5/2018 | Yeh | H01L 29/78696 |
| 2018/0182849 A1* | 6/2018 | Alian | H01L 29/4232 |
| 2018/0219055 A1* | 8/2018 | Bu | H01L 51/102 |
| 2018/0261702 A1* | 9/2018 | Bessonov | H01L 31/02363 |
| 2019/0165045 A1* | 5/2019 | Chung | H01L 27/2454 |
| 2019/0181224 A1* | 6/2019 | Zhang | H01L 29/0673 |
| 2019/0244933 A1* | 8/2019 | Or-Bach | H01L 21/6835 |

FOREIGN PATENT DOCUMENTS

| | | |
|---|---|---|
| KR | 2013-0092752 A | 8/2013 |
| KR | 2014-0075460 A | 6/2014 |
| KR | 2015-0062656 A | 6/2015 |

OTHER PUBLICATIONS

Extended European Search Report dated Aug. 8, 2016 issued in corresponding European Patent Application No. 16155329.2.

Notice Notice of Allowance dated Oct. 9, 2018 issued in co-pending U.S. Appl. No. 15/010,807.

* cited by examiner

SEMICONDUCTOR DEVICE INCLUDING METAL-2 DIMENSIONAL MATERIAL-SEMICONDUCTOR CONTACT

CROSS-REFERENCE TO RELATED APPLICATION

This application is a continuation of U.S. application Ser. No. 15/010,807, filed on Jan. 29, 2016, which claims the benefit of Korean Patent Application No. 10-2015-0070567, filed on May 20, 2015, and Korean Patent Application No. 10-2015-0110233, filed on Aug. 4, 2015, in the Korean Intellectual Property Office, the disclosures of each of which are incorporated herein in their entirety by reference.

BACKGROUND

1. Field

Example embodiments relate to a semiconductor device, and more particularly, to a semiconductor device including a two-dimensional material layer that has a two-dimensional crystal structure and is interposed between a metal and a semiconductor to reduce a contact resistivity therebetween.

2. Description of the Related Art

A semiconductor device includes a metal and a semiconductor that are in contact with each other in a particular part of the semiconductor device to externally exchange electric signals. The metal has a lower resistivity than the semiconductor and can be more easily wired to the external environment. In this case, however, a contact resistivity is generated due to a hetero-contact between the semiconductor and metal.

To reduce such contact resistivity, various methods to reduce a Schottky energy barrier between a semiconductor and a metal have been suggested. For example, a metal having a work function of about 4 eV is used for an n-type semiconductor and a metal having a work function of about 5 eV is used for a p-type semiconductor. However, because a phenomenon occurs when a work function of a metal is pinned on a surface of a semiconductor, there is a limit in reducing the Schottky energy barrier regardless of a type of the metal. As another method, a depletion width may be reduced by doping a surface of a semiconductor contacting a metal to have a relatively high concentration. However, although a doping concentration needs to be further increased as a demand for a semiconductor device having a smaller size has gradually increased, there is a limit in methods of increasing a doping concentration, maintaining a stable doping state, and reducing a depletion width according to an increase in the doping concentration.

SUMMARY

Additional aspects will be set forth in part in the description which follows and, in part, will be apparent from the description, or may be learned by practice of the presented example embodiments.

According to example embodiments, a semiconductor device includes a semiconductor layer including a well region doped to a first conductivity type and a source region and a drain region doped to a second conductivity type electrically opposite the first conductivity type, a metal layer electrically contacting the semiconductor layer, and a two-dimensional material layer between the semiconductor layer and the metal layer, the two-dimensional material layer having a two-dimensional crystal structure, and including a first two-dimensional material layer on the source region and a second two-dimensional material layer on the drain region. The metal layer includes a source electrode on the first two-dimensional material layer and a drain electrode on the second two-dimensional material layer.

The two-dimensional material layer may be formed of a carbon-based 2D material including at least one of graphene and nano crystalline graphene (nc-G).

The two-dimensional material layer may be formed of a transition metal dichalcogenide including at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

The two-dimensional material layer may include at least one of $TiO_x$, $NbO_x$, $MnO_x$, $VaO_x$, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, InTe, hexagonal BN (h-BN), and phosphorene.

The two-dimensional material layer may have a doped structure obtained by one of replacing some elements of the two-dimensional crystal structure with other elements and combining other elements to the two-dimensional crystal structure.

The two-dimensional material layer may be one of a nanowire pattern, a nano-slit pattern, a nano-dot pattern and a nano-hole pattern.

A thickness of the two-dimensional material layer may be such that a contact resistivity between the semiconductor layer and the metal layer is equal to or less than $10-7$ $\Omega cm^2$.

The thickness of the two-dimensional material layer may be within a range of about 0.3 nm to about 5 nm.

The two-dimensional material layer may include multiple layers of a single-layer two-dimensional crystal structure having a thickness T1, and the total thickness TD of the two-dimensional material layer may be a sum of each of the thicknesses T1 of the single-layer two-dimensional crystal structures.

A surface of the semiconductor layer contacting the two-dimensional material layer may be surface-treated with monolayer atoms.

The metal layer may include a metal material and the semiconductor layer may include a semiconductor material, and the semiconductor layer, the mixture layer between the two-dimensional material layer and the metal layer, the mixture layer including the metal material and the semiconductor material.

The semiconductor device may further include a gate insulating film on the well region between the source region and the drain region, a gate electrode on the gate insulating film, and a spacer surrounding side walls of the gate insulating film and the gate electrode.

Each of the first two-dimensional material layer and the second two-dimensional material layer may contact a lower surface of the spacer.

Each of the first two-dimensional material layer and the second two-dimensional material layer may contact a side surface of the spacer.

A doping concentration of each of the source region and the drain region may be equal to or higher than $10^{19}/cm^3$.

According to example embodiments, a semiconductor device includes a gate insulating film between a gate electrode and an undoped semiconductor layer, a metal layer electrically contacting the semiconductor layer, and a two-dimensional material layer between the semiconductor layer and metal layer, the two-dimensional material layer having a two-dimensional crystal structure including non-carbon based two-dimensional crystals.

The metal layer may include a source electrode on the gate insulating film and facing a first side surface of the semiconductor layer, and a drain electrode on the gate insulating film and facing a second side surface of the semiconductor layer, and the two-dimensional material layer may include a first two-dimensional material layer between the source electrode and the first side surface of the semiconductor layer and a second two-dimensional material layer between the drain electrode and the second side surface of the semiconductor layer.

The first two-dimensional material layer may be bent to extend from the first side surface of the semiconductor layer up to a first region of an upper surface of the semiconductor layer, and the second two-dimensional material layer may be bent to extend from the second side surface of the semiconductor layer up to a second region of the upper surface of the semiconductor layer.

According to example embodiments, a semiconductor device includes a gate insulating film between an undoped semiconductor layer and a gate electrode, a first two-dimensional material layer adjacent to a first side surface of the gate insulating film, the first two-dimensional material layer having a two-dimensional crystal structure including non-carbon based two-dimensional crystals, a second two-dimensional material layer adjacent to a second side surface of the gate insulating film opposite the first side surface, the second two-dimensional material layer having a two-dimensional crystal structure including non-carbon based two-dimensional crystals, a source electrode on the first two-dimensional material layer, and a drain electrode on the second two-dimensional material layer.

The source electrode and the drain electrode may be spaced apart from the gate insulating film.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Reference will now be made in detail to a semiconductor device including contact of metal-two dimensional material-semiconductor, examples of which are illustrated in the accompanying drawings, wherein like reference numerals refer to like elements throughout. Also, the size of each layer illustrated in the drawings may be exaggerated for convenience of explanation and clarity. In this regard, the present embodiments may have different forms and should not be construed as being limited to the descriptions set forth herein. Accordingly, the embodiments are merely described below, by referring to the figures, to explain aspects of the present description. In a layer structure, when a constituent element is disposed "above" or "on" to another constituent element, the constituent element may be only directly on the other constituent element or above the other constituent elements in a non-contact manner.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1:
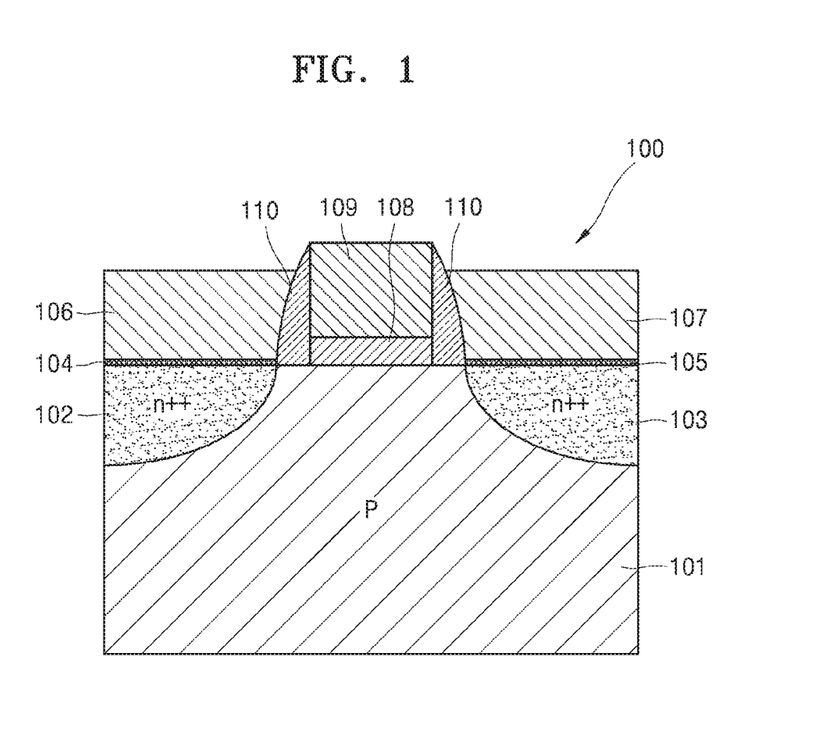
FIG. 1 is a cross-sectional view schematically illustrating a structure of a semiconductor device according to example embodiments.

FIG. 1 is a cross-sectional view schematically illustrating a structure of a semiconductor device 100 according to example embodiments. Referring to FIG. 1, the semiconductor device 100 according to example embodiments may include semiconductor layers 101, 102, and 103, metal layers 106 and 107 electrically connected to the semiconductor layers 101, 102, and 103, and two-dimensional (2D) material layers 104 and 105 disposed between the semiconductor layers 101, 102, and 103 and the metal layers 106 and 107.

The semiconductor layers 101, 102, and 103 may include, for example, a well region 101 doped to a first conductivity type, a source region 102 doped to a second conductivity type opposite the first conductivity type, and a drain region 103 doped to the second conductivity type. Although FIG. 1 illustrates that the well region 101 is doped to a p-type conductivity and the source and drain regions 102 and 103 are doped to an n-type conductivity, this is a mere example and the well region 101 may be doped to an n-type conductivity and the source and drain regions 102 and 103 may be doped to a p-type conductivity. The well region 101 may be doped to a relatively low concentration of about $10^{14} \sim 10^{18}/cm^3$, and the source and drain regions 102 and 103 may be doped to a relatively high concentration of about $10^{19}/cm^3$ or higher to reduce a depletion width.

The semiconductor layers 101, 102, and 103 may be a Group IV semiconductor, e.g., silicon (Si) or germanium (Ge), a Group III-V compound semiconductor, e.g., GaAs or GaP, a Group II-VI compound semiconductor, e.g., CdS or ZnTe, a Group IV-VI compound semiconductor, e.g., PbS, a Group IV-IV compound semiconductor, e.g., SiC, an oxide semiconductor, e.g., IGZO, or a 2D crystal structure semiconductor having a bandgap, e.g., $MoS_2$.

Also, upper surfaces of the source region 102 and the drain region 103 contacting the 2D material layers 104 and 105, which are described later, may be surface-treated with monolayer atoms to improve combination properties with the 2D material layers 104 and 105. Because the semiconductor, for example, silicon, generally has a relatively weak binding force with respect to a 2D material, the 2D material layers 104 and 105 respectively disposed on the source region 102 and the drain region 103 may be more easily detached from the source region 102 and the drain region 103. To prevent or inhibit the above phenomenon, the upper surfaces of the source region 102 and the drain region 103 may be surface-treated with elements exhibiting a desirable binding force with respect to the 2D material layers 104 and 105. For example, oxygen, sulfur, or selenium may be combined, in a monolayer, on the surfaces of the source region 102 and the drain region 103.

The 2D material layers 104 and 105 may include a first 2D material layer 104 disposed on the source region 102 and a second 2D material layer 105 disposed on the drain region 103. The 2D material layers 104 and 105 may be formed in a layered structure because the 2D material layers 104 and 105 are formed of a 2D material having a 2D crystal structure. Layers of the 2D material layers 104 and 105 may weakly interact with each other through the Van der Waals force. Accordingly, because the 2D material layers 104 and 105 may be formed in units of layers, a thickness thereof may be more easily adjusted.

The 2D material layers 104 and 105 may be formed of a carbon-based 2D material or a non-carbon based 2D material. The carbon-based 2D material may be formed in a crystal of a carbon element, for example, graphene or nano crystalline graphene (nc-G). General graphene is formed on catalyst metal in a chemical vapor deposition (CVD) method at a relatively high temperature process of about 700° C. to 1000° C. and a grain size thereof is about several micrometers. Because the general graphene may grow on metal, e.g., nickel (Ni) or copper (Cu), the general graphene may be transferred to another layer like semiconductor after growth. In contrast, nano crystalline graphene may be formed at a relatively low temperature of about 600° C. by an inductively coupled plasma CVD (ICP-CVD) method or a plasma enhanced CVD (PE-CVD) method, and a grain size thereof is about 100 nm or less. The nano crystalline graphene may grow on a semiconductor, for example, silicon, at a relatively low temperature.

The non-carbon based 2D material is a 2D material including elements other than carbon. A typical non-carbon based 2D material includes a transition metal dichalcogenide (TMD) that is a compound of transition metal and a chalcogen element. For example, TMD may include $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.$SnTe_2$ There are various non-carbon based 2D materials other than TMD. For example, the non-carbon based 2D material may include hexagonal BN (h-BN), phosphorene, $TiO_x$, $NbO_x$, $MnO_x$, $VaO_x$, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, and InTe. The h-BN is formed in a hexagonal crystal structure by combining boron (B) and nitrogen (N). The phosphorene is a 2D allotropy of black phosphorus.

Although any of the above materials may be used for the 2D material layers 104 and 105, when the semiconductor layers 101, 102, and 103 are semiconductors having a 2D crystal structure, the material of the 2D material layers 104 and 105 may be chosen to be different from that of the semiconductor layers 101, 102, and 103.

Also, the 2D material layers 104 and 105 may use the above materials without modifying them, and/or the materials may be doped to further improve electrical characteristics of the semiconductor device 100. In other words, the 2D material layers 104 and 105 may have a doped structure by replacing some of elements forming the 2D crystal structure of the 2D material layers 104 and 105 with other elements or additionally combining other elements to the 2D crystal structure. For example, when the 2D material layers 104 and 105 are graphene, some of the carbon may be replaced with or combined with other elements, e.g., boron or nitrogen.

The metal layers 106 and 107 may include a source electrode 106 disposed on the first 2D material layer 104 and a drain electrode 107 disposed on the second 2D material layer 105. The metal layers 106 and 107 including the source electrode 106 and the drain electrode 107 may include, for example, a metal, e.g., magnesium (Mg), aluminum (Al), scandium (Sc), titanium (Ti), vanadium (V), chrome (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), or an alloy thereof.

Also, the semiconductor device 100 may further include a gate insulating film 108 disposed on the well region 101 between the source region 102 and the drain region 103, a gate electrode 109 disposed on the gate insulating film 108, and a spacer 110 surrounding side walls of the gate insulating film 108 and the gate electrode 109. The spacer 110 may prevent or inhibit the gate insulating film 108 and the gate electrode 109 from directly contacting the source electrode 106 and the drain electrode 107. The gate insulating film 108 may be formed of $SiO_2$, $SiN_x$, $HfO_2$, or $Al_2O_3$, and the gate electrode 109 may be formed of polysilicon or the same metal material as the metal layers 106 and 107. The spacer 110 may be formed of an insulation material, e.g., $SiO_2$ or $SiN_x$.

As described above, the semiconductor device 100 according to example embodiments may include a 2D material interposed between semiconductor and metal. In detail, the semiconductor device 100 may include the first 2D material layer 104 interposed between the source region 102 and the source electrode 106 and the second 2D material layer 105 interposed between the drain region 103 and the drain electrode 107. Because a surface of the 2D material layers 104 and 105 have no reactant, a phenomenon in which work functions of metals of the source electrode 106 and the drain electrode 107 are pinned on the surfaces of the source region 102 and the drain region 103 may be prevented or inhibited. Accordingly, an effect according to a work function intrinsic to the metals of the source electrode 106 and the drain electrode 107 may occur, and as a result, contact resistivity may be reduced between the source region 102 and the source electrode 106, and between the drain region 103 and the drain electrode 107.

Figure 2:
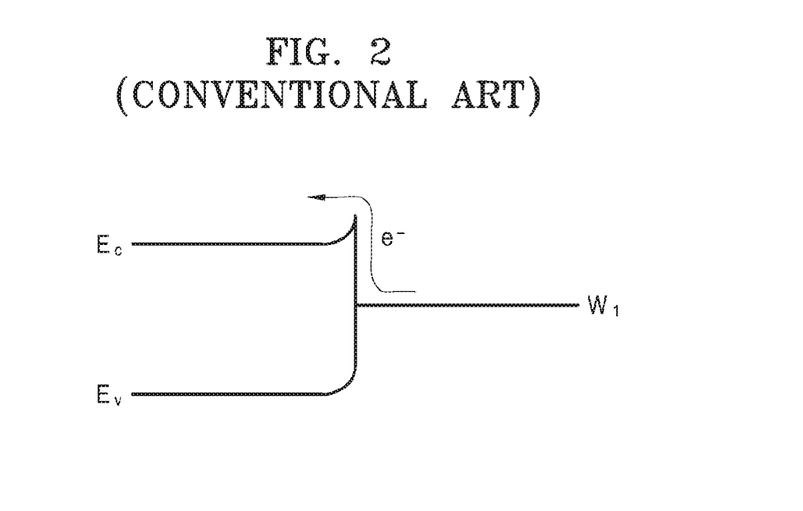
FIG. 2 schematically illustrates an energy band diagram of a semiconductor device according to a comparative example, the semiconductor device not including a two-dimensional material layer.

For example, FIG. 2 schematically illustrates an energy band diagram in a semiconductor device according to a comparative example having no 2D material layer 104 and 105. In FIG. 2, "Ec" denotes a level of a conduction band of semiconductor, "Ev" denotes a level of a valence band of semiconductor, and "W1" denotes a work function of metal.

Referring to FIG. 2, in the case of a comparative example having no 2D material layers 104 and 105, because a work function of metal on an interface between semiconductor and metal is pinned to W1, a relatively high Schottky energy barrier is generated. Accordingly, the contact resistivity is increased on a contact surface of the semiconductor and the metal.

Figure 3A:
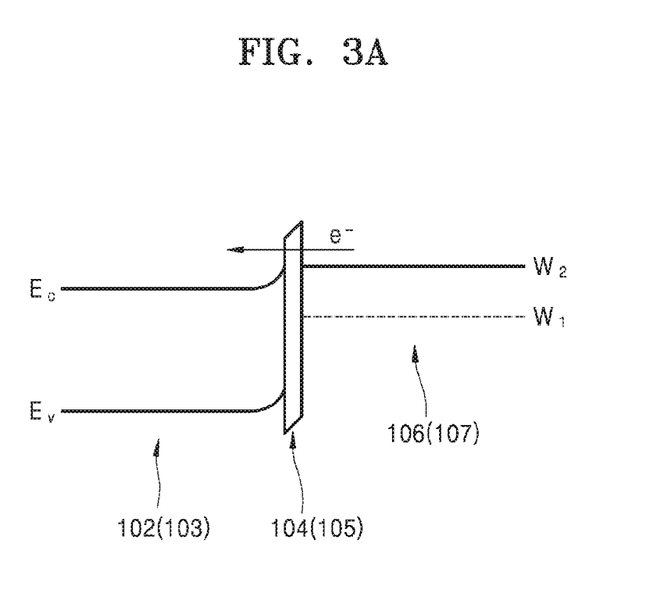
FIG. 3A schematically illustrates an energy band diagram of the semiconductor device illustrated in FIG. 1 when a two-dimensional material layer therein is a non-carbon based two-dimensional crystal.

FIG. 3A schematically illustrates an energy band diagram in the semiconductor device 100 illustrated in FIG. 1 when the 2D material layers 104 and 105 are non-carbon based 2D crystals. In example embodiments, the 2D material layers 104 and 105 may cause an effect according to a work function W2 intrinsic to the metals of the source electrode 106 and the drain electrode 107. Accordingly, a Schottky energy barrier between the source region 102 and the source electrode 106 and between the drain region 103 and the drain electrode 107 may be lowered. Also, because the thicknesses of the 2D material layers 104 and 105 are sufficiently small such that tunneling may occur, electrons may tunnel through the 2D material layers 104 and 105. Accordingly, the contact resistivity between the source region 102 and the source electrode 106 and between the drain region 103 and the drain electrode 107 may be lowered. For example, the materials and thicknesses of the 2D material layers 104 and 105 may be selected such that the contact resistivity is equal to or less than $10^{-7}$ $\Omega cm^2$.

Figure 3B:
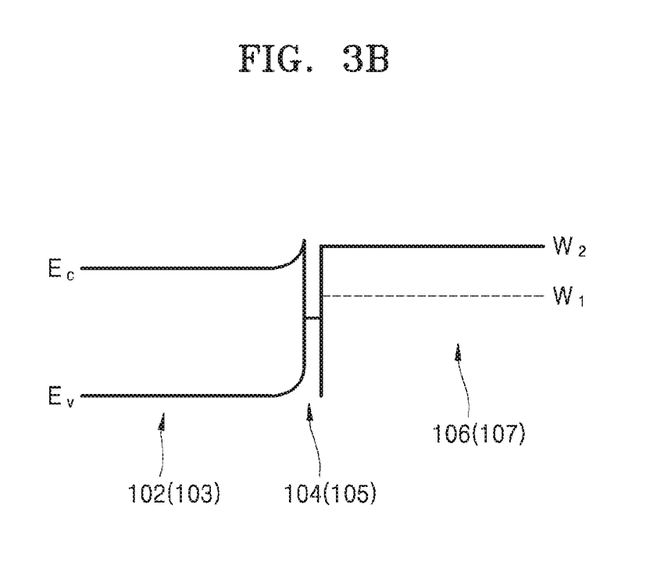
FIG. 3B schematically illustrates an energy band diagram of the semiconductor device illustrated in FIG. 1 when the two-dimensional material layer therein is a carbon-based two-dimensional crystal.

FIG. 3B schematically illustrates an energy band diagram in the semiconductor device 100 illustrated in FIG. 1 when the 2D material layers 104 and 106 are carbon-based 2D crystals. As illustrated in FIG. 3B, a carbon-based 2D crystal, e.g., graphene, having no bandgap is different from the non-carbon based 2D crystal having a bandgap. When the carbon-based 2D crystal is used, the same effect as in the case of using the non-carbon based 2D crystal may be obtained.

Figure 4:
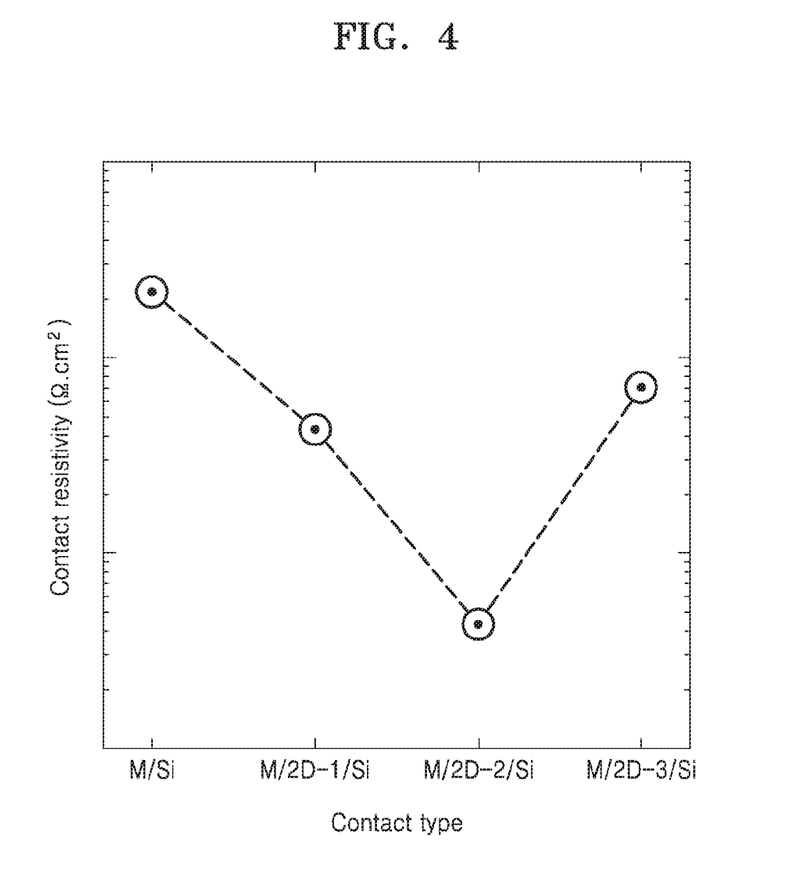
FIG. 4 is a graph showing a change in a contact resistivity according to a type of a two-dimensional material layer.

FIG. 4 is a graph showing a change in contact resistivity according to types of the 2D material layers 104 and 105. In the graph of FIG. 4, titanium (Ti) is used as the metal and silicon (Si) is used as the semiconductor. Also, the leftmost of the graph of FIG. 4 indicates contact resistivity in a semiconductor device according to a comparative example having no 2D material layers 104 and 105, and graphene, h-BN, and $MoS_2$ are respectively used for "2D-1", "2D-1", "2D-2", and "2D-3" sequentially in a direction toward the right, as the 2D material layers 104 and 105. As it may be seen from the graph of FIG. 4, the contact resistivity is highest when no 2D material layers 104 and 105 exist, whereas the contact resistivity may be reduced when the 2D material layers 104 and 105 are used.

Figure 5:
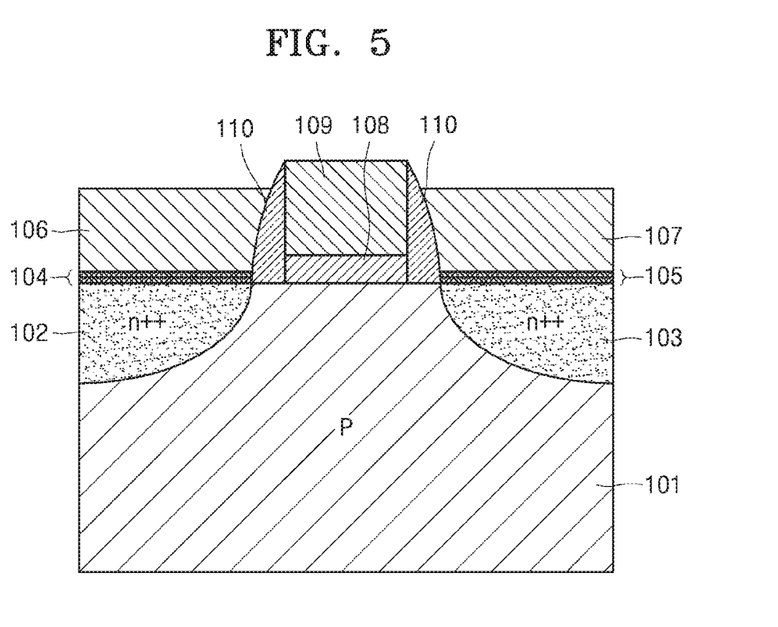
FIGS. 5 and 6 are cross-sectional views schematically illustrating structures of semiconductor devices having different numbers of two-dimensional material layers.
Figure 6:
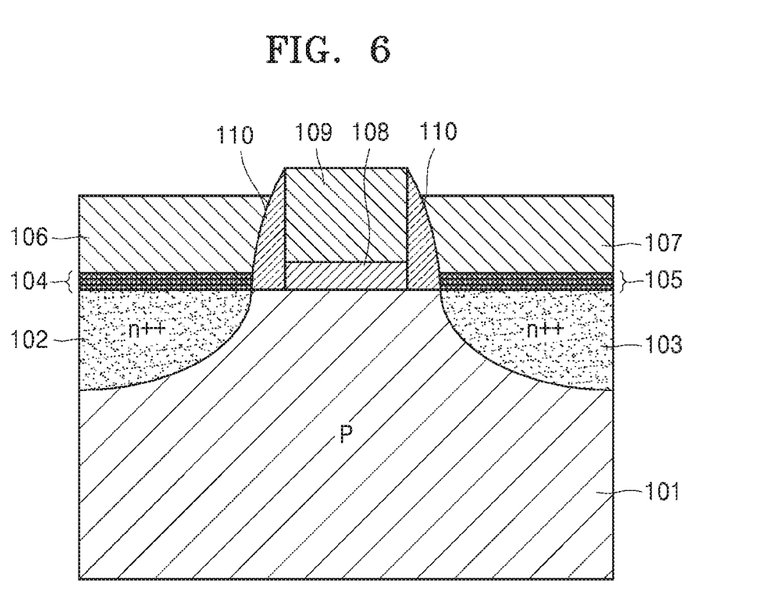

Also, each of the 2D material layers 104 and 105 have a 2D layered crystal structure and may be formed layer by layer. Accordingly, the thicknesses of the 2D material layers 104 and 105 may be easily adjusted within 5 nm according to the number of layers of the 2D material layers 104 and 105 and uniformity of the thickness is improved. For example, FIGS. 5 and 6 are cross-sectional views schematically illustrating structures of the semiconductor devices 100 having different numbers of layers of the 2D material layers 104 and 105. Although FIG. 1 illustrates that each of the 2D material layers 104 and 105 is a single layer, each of the 2D material layers 104 and 105 may be formed in double layers as illustrated in FIG. 5, triple layers as illustrated in FIG. 6, or higher. Because the thickness of each of the 2D material layers 104 and 105 may be simply a multiple of the thickness of the single-layer 2D crystal structure, the thickness of each of the 2D material layers 104 and 105 may be simply determined by multiplication of the thickness of the single-layer 2D crystal structure and the number of layers thereof. For example, the number of layers may be selected such that the thickness of the 2D material layers 104 and 105 may be within a range of about 0.3 nm to 5 nm. As such, because the thickness uniformity of the 2D material layers 104 and 105 is desirable, uniform contact resistivity may be secured in an overall area between the source region 102 and the source electrode 106 and between the drain region 103 and the drain electrode 107.

Also, because the 2D material layers 104 and 105 generally have relatively high thermal stability, durability of the semiconductor device 100 may be improved. Also, because the 2D material layers 104 and 105 may function as a diffusion barrier with respect to semiconductor atoms and metal atoms, no additional diffusion barrier is needed to be formed between the source region 102 and the source electrode 106 and between the drain region 103 and the drain electrode 107. Accordingly, total resistivity of the semiconductor device 100 may be additionally reduced.

Figure 7A:
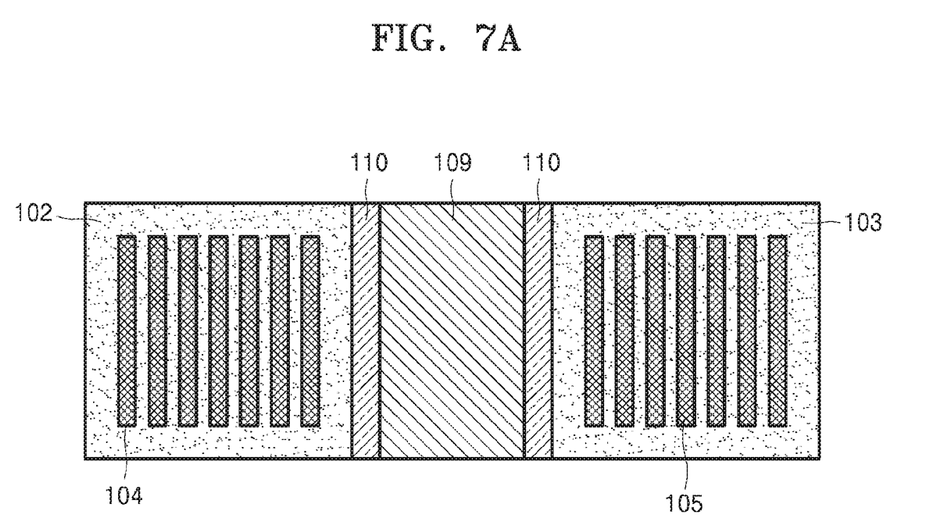
FIGS. 7A to 7D are plan views schematically illustrating examples of various patterns of a two-dimensional material layer.
Figure 7B:
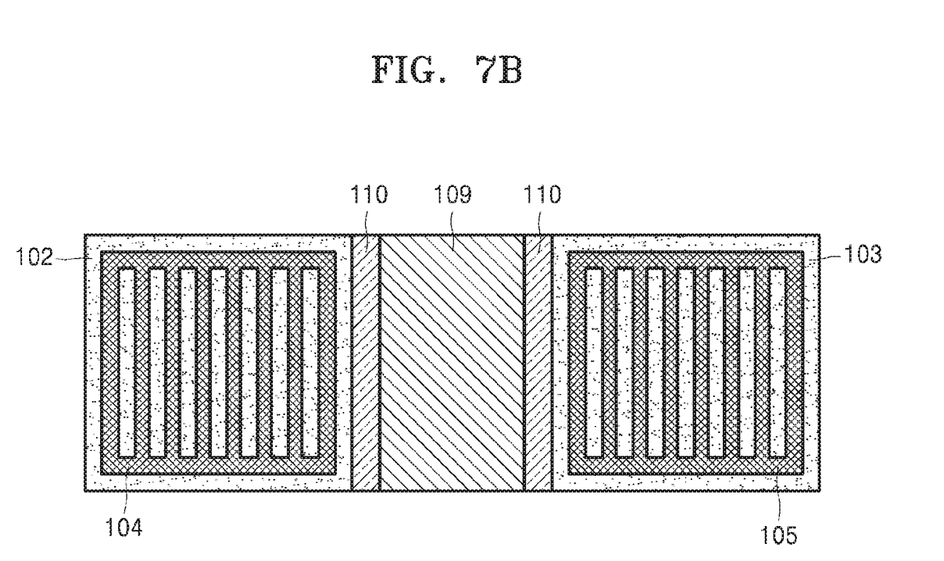
Figure 7C:
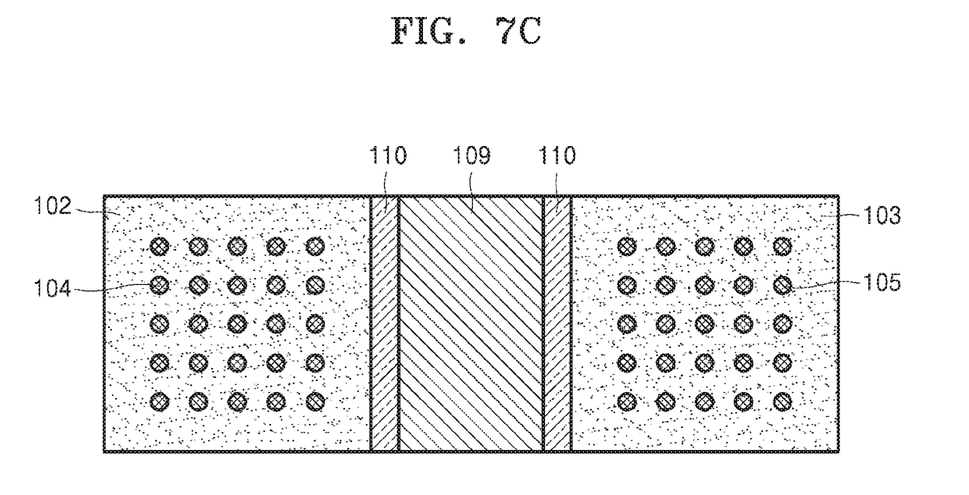
Figure 7D:
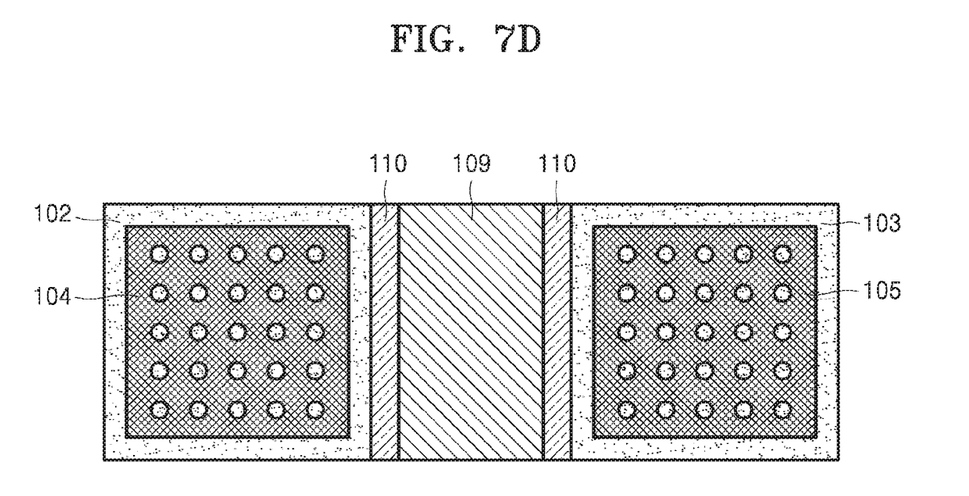

The 2D material layers 104 and 105 may completely fill the gap between the source region 102 and the source electrode 106 and between the drain region 103 and the drain electrode 107. However, when necessary, the 2D material layers 104 and 105 may be patterned such that a part of the source region 102 directly contacts the source electrode 106 and a part of the drain region 103 directly contacts the drain electrode 107. For example, FIGS. 7A to 7D are plan views schematically illustrating examples of various patterns of the 2D material layers 104 and 105. As illustrated in FIG. 7A, the 2D material layers 104 and 105 may be patterned in a form of a plurality of parallel nanowires. Also, as illustrated in FIG. 7B, the 2D material layers 104 and 105 may be patterned to have a form of a plurality of parallel nano-slits. As illustrated in FIG. 7C, the 2D material layers 104 and 105 may be patterned to have a form of a plurality of nano-dots disposed in a 2D array. In contrast, as illustrated in FIG. 7D, the 2D material layers 104 and 105 may be patterned to have a plurality of nano-holes disposed in a 2D array. As such, as the electrical characteristics, for example, a bandgap, of the 2D material layers 104 and 105 are changed by patterning the 2D material layers 104 and 105 in various forms, the characteristics of the semiconductor device 100 including the contact resistivity may be adjusted.

Figure 8:
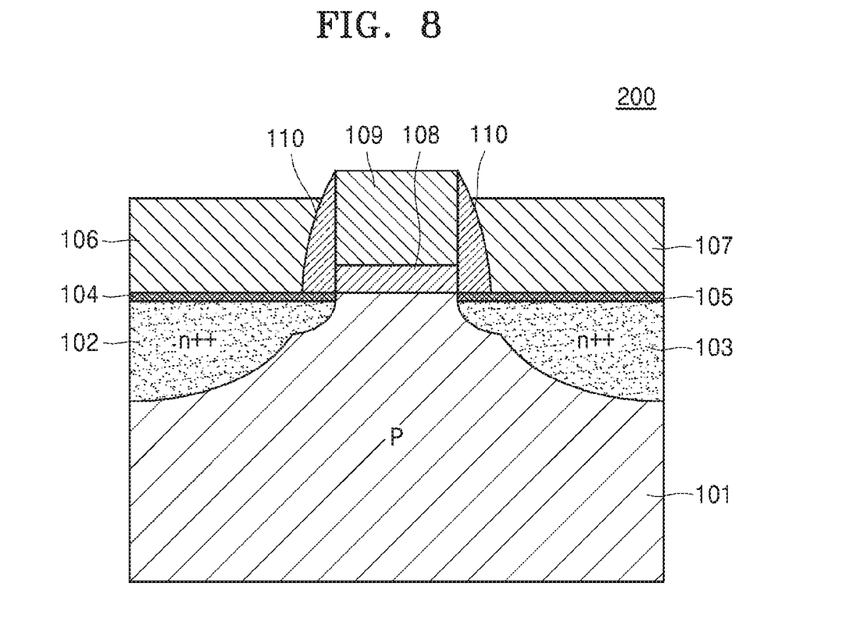
FIG. 8 is a cross-sectional view schematically illustrating a structure of a semiconductor device according to example embodiments.

FIG. 8 is a cross-sectional view schematically illustrating a structure of a semiconductor device 200 according to example embodiments. In the case of the semiconductor device 100 illustrated in FIG. 1, the well region 101, the source region 102, and the drain region 103 may have the same surface height, and the 2D material layers 104 and 105 extend to contact a side surface of the spacer 110. In contrast, in the semiconductor device 200 of FIG. 8, the 2D material layers 104 and 105 extend to contact a lower surface of the spacer 110. To this end, an upper surface of the well region 101 may be formed to be higher than upper surfaces of the source region 102 and the drain region 103. For example, a difference in the height between the well region 101 and the source and drain regions 102 and 103 may be the same as the thicknesses of the 2D material layers 104 and 105. The 2D material layers 104 and 105 may extend to an interface between the spacer 110 and the gate insulating film 108 along a lower surface of the spacer 110. In example embodiments, the interface between the source and drain regions 102 and 103 and the well region 101 may match the interface between the spacer 110 and the gate insulating film 108. Accordingly, as a contact surface between the source and drain regions 102 and 103 and the 2D material layers 104 and 105 increases, the contact resistivity may be additionally decreased.

Figure 9:
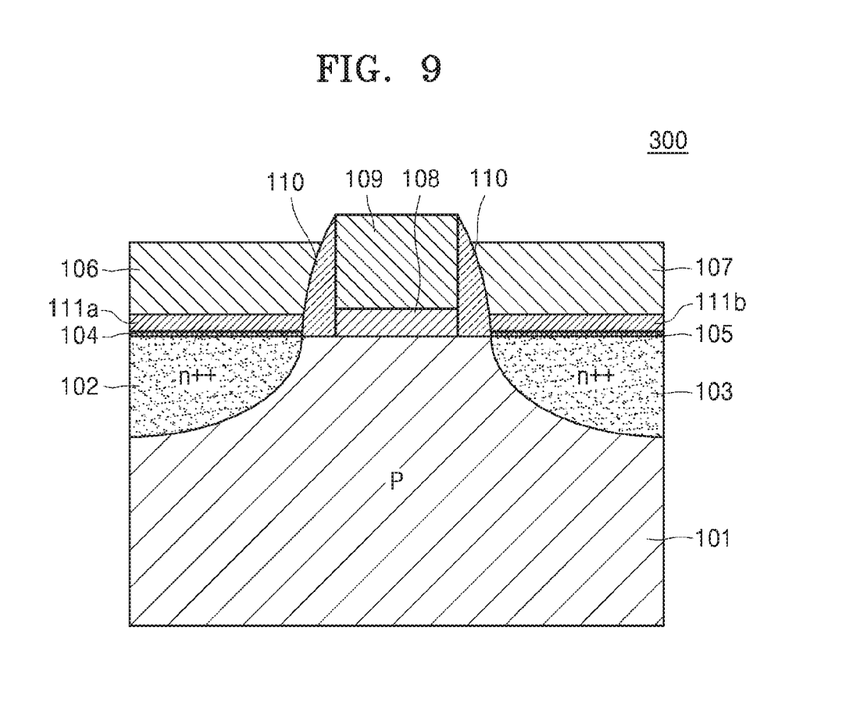
FIG. 9 is a cross-sectional view schematically illustrating a structure of a semiconductor device according to example embodiments.

FIG. 9 is a cross-sectional view schematically illustrating a structure of a semiconductor device 300 according to example embodiments. When compared to the semiconductor device 100 of FIG. 1, the semiconductor device 300 of FIG. 9 may further include mixture layers 111a and 111b disposed between the 2D material layers 104 and 105 and the metal layers 106 and 107. In detail, the semiconductor device 300 may include a first mixture layer 111a disposed between the first 2D material layer 104 and the source electrode 106, and a second mixture layer 111b disposed between the second 2D material layer 105 and the drain electrode 107. The first mixture layer 111a may be a mixture of a metal material forming the source electrode 106 and a semiconductor material forming the source region 102. Likewise, the second mixture layer 111b may be a mixture of a metal material forming the drain electrode 107 and a semiconductor material forming the drain region 103. For example, when the semiconductor layers 101, 102, and 103 are formed of silicon, the mixture layers 111a and 111b may be formed of silicide. The mixture layers 111a and 111b may further lower the Schottky energy barrier so that the contact resistivity may be further reduced.

The above-described semiconductor devices 100, 200, and 300 are unipolar metal oxide semiconductor field effect transistors (MOSFET) in which the well region 101 in the semiconductor layers 101, 102, and 103 is doped to have a polarity opposite to the source and drain regions 102 and 103. However, the above-described principle may be applied not only to the unipolar MOSFET but also to any semiconductor device having hetero-contact between metal and semiconductor. For example, when all regions of a semiconductor layer are undoped or all regions of a semiconductor layer are doped to the same polarity, contact resistivity may be reduced by interposing a 2D material between semiconductor and metal.

Figure 10:
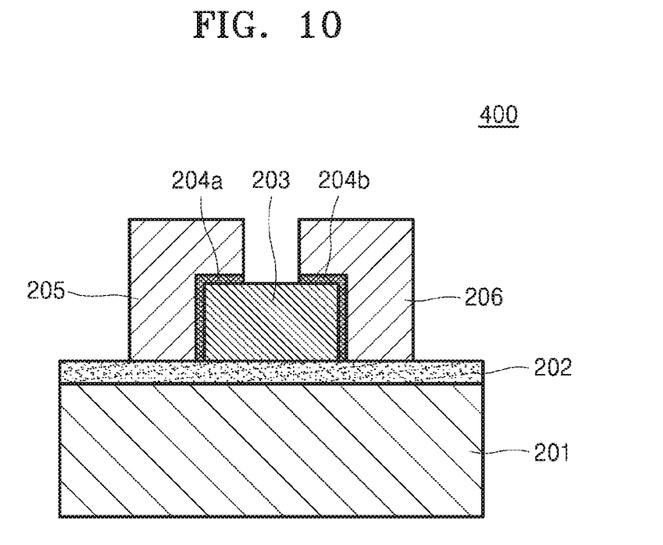
FIG. 10 is a cross-sectional view schematically illustrating a structure of a semiconductor device according to example embodiments.

For example, FIG. 10 is a cross-sectional view schematically illustrating a structure of a semiconductor device 400 according to example embodiments. Referring to FIG. 10, the semiconductor device 400 may include a gate electrode 201, a gate insulating film 202 disposed on the gate electrode 201, a semiconductor layer 203 disposed on the gate insulating film 202, metal layers 205 and 206 disposed on both sides of the semiconductor layer 203 and electrically contacting the semiconductor layer 203, and 2D material layers 204a and 204b disposed between the semiconductor layer 203 and the metal layers 205 and 206 and having a 2D crystal structure. The semiconductor layer 203 functions as a channel layer and may be undoped.

The metal layers 205 and 206 may include a source electrode 205 disposed on the gate insulating film 202 and facing one side of the semiconductor layer 203 and a drain electrode 206 disposed on the gate insulating film 202 and facing the other side of the semiconductor layer 203. Also, the gate electrode 201 may also be formed of a metal material. The above-described materials may be used as the metal material of the gate electrode 201, the source electrode 205, and the drain electrode 206.

The 2D material layers 204a and 204b may include a first 2D material layer 204a disposed between the source electrode 205 and one side surface of the semiconductor layer 203 and a second 2D material layer 204b disposed between the drain electrode 206 and the other side surface of the semiconductor layer 203. As illustrated in FIG. 10, the first 2D material layer 204a may extend from one side surface of the semiconductor layer 203 to a partial area of the upper surface thereof. Also, the second 2D material layer 204b may extend from the other side surface of the semiconductor layer 203 to another partial area of the upper surface thereof, not contacting the first 2D material layer 204a. Accordingly, the 2D material layers 204a and 204b may be bent at about 90° C. between the side surface of the semiconductor layer 203 and the upper surface thereof. The 2D material layers 204a and 204b may be formed of the above-described 2D crystal material. In particular, a non-carbon based 2D crystal that is formed of crystals of elements other than carbon may be used for the 2D material layers 204a and 204b.

Figure 11:
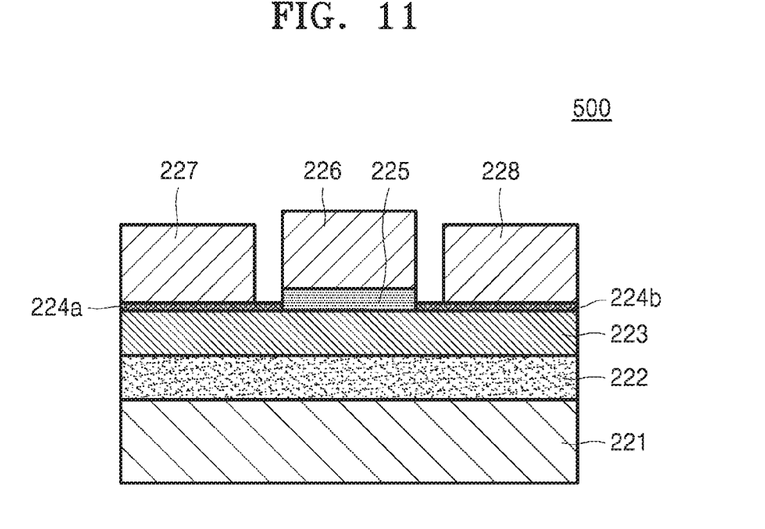
FIG. 11 is a cross-sectional view schematically illustrating a structure of a semiconductor device according to example embodiments.

FIG. 11 is a cross-sectional view schematically illustrating a structure of a semiconductor device 500 according to example embodiments. While the semiconductor device 400 of FIG. 10 has a bottom gate structure in which the gate electrode 201 is disposed under the semiconductor layer 203, the semiconductor device 500 of FIG. 11 has top gate structure which is different from the bottom gate structure of the semiconductor device 400 of FIG. 10. Referring to FIG. 11, the semiconductor device 500 may include a substrate 221, an insulation layer 222 disposed on an upper surface of the substrate 221, a semiconductor layer 223 disposed on an upper surface of the insulation layer 222, a gate insulating film 225 disposed in a partial area of an upper surface of the semiconductor layer 223, a gate electrode 226 disposed on an upper surface of the gate insulating film 225, 2D material layers 224a and 224b disposed on another area of the upper surface of the semiconductor layer 223, and metal layers 227 and 228 respectively disposed on upper surfaces of the 2D material layers 224a and 224b. The semiconductor layer 223 functions as a channel layer and may be undoped.

The 2D material layers 224a and 224b may include a first 2D material layer 224a and a second 2D material layer 224b that are disposed adjacent to opposite side surfaces of the gate insulating film 225 on the upper surface of the semiconductor layer 223. For example, the gate insulating film 225 may be disposed in a central area of the upper surface of the semiconductor layer 223, and the first 2D material layer 224a and the second 2D material layer 224b may be disposed at the opposite sides of the gate insulating film 225. Although FIG. 11 illustrates that the first and second 2D material layers 224a and 224b are in closely contact with the gate insulating film 225, the first and second 2D material layers 224a and 224b may be spaced apart from the gate insulating film 225. In this case, a part of the upper surface of the semiconductor layer 223 may be exposed between the gate insulating film 225 and the first and second 2D material layers 224a and 224b.

Also, the metal layers 227 and 228 may include a source electrode 227 disposed on the first 2D material layer 224a and a drain electrode 228 disposed on the second 2D material layer 224b. The materials described with reference to FIG. 10 may be used for the metal layers 227 and 228 and the 2D material layers 224a and 224b. As illustrated in FIG. 11, the source electrode 227 and the drain electrode 228 may be partially and respectively disposed on the first 2D material layer 224a and the second 2D material layer 224b and may be spaced apart from the gate insulating film 225. Accordingly, parts of the upper surfaces of the first 2D material layer 224a and the second 2D material layer 224b may be exposed. Nevertheless, the source electrode 227 and the drain electrode 228 may completely cover the entire surfaces of the first 2D material layer 224a and the second 2D material layer 224b.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A semiconductor device comprising: a substrate, an insulation layer disposed on an upper surface of the substrate, a semiconductor layer, including a well region doped to a first conductivity type, disposed on an upper surface of the insulation layer, and a source region and a drain region doped to a second conductivity type electrically opposite the first conductivity type; a metal layer electrically contacting the semiconductor layer; and a two-dimensional material layer between the semiconductor layer and the metal layer, the two-dimensional material layer having a two-dimensional crystal structure, the two-dimensional layer being patterned in one of a plurality of nanowires, a plurality of nano-slits, and a plurality of nano-dots, the two-dimensional material layer including, a first two-dimensional material layer on the source region, the metal layer including a source electrode on the first two-dimensional material layer, and a second two-dimensional material layer on the drain region, the metal layer including a drain electrode on the second two-dimensional material layer; a gate insulating film on the well region between the source region and the drain region; a gate electrode on the gate insulating film; and the first two-dimensional material layer and the second two-dimensional material layer contact sides of the gate insulating film; and parts of the upper surfaces of the first two-dimensional material layer and the second two-dimensional material layer next to the gate insulating film are exposed.

2. The semiconductor device of claim 1, wherein the two-dimensional material layer includes a carbon-based 2D material.

3. The semiconductor device of claim 2, wherein the carbon-based 2D material is at least one of graphene and nano crystalline graphene (nc-G).

4. The semiconductor device of claim 1, wherein the two-dimensional material layer includes a transition metal dichalcogenide.

5. The semiconductor device of claim 4, wherein the transition metal dichalcogenide includes at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, P and $SnTe_2$.

6. The semiconductor device of claim 1, wherein the two-dimensional material layer includes at least one of $TiO_x$, $NbO_x$, $MnO_x$, $VaO_x$, $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, InTe, hexagonal BN (h-BN), and phosphorene.

7. The semiconductor device of claim 1, wherein the two-dimensional material layer has a doped structure obtained by one of replacing some elements of the two-dimensional crystal structure with other elements and combining other elements to the two-dimensional crystal structure.

8. The semiconductor device of claim 1, wherein a thickness of the two-dimensional material layer is such that a contact resistivity between the semiconductor layer and the metal layer is equal to or less than $10^{-7}$ $\Omega/cm^2$.

9. The semiconductor device of claim 8, wherein the thickness of the two-dimensional material layer is within a range of about 0.3 nm to about 5 nm.

10. The semiconductor device of claim 8, wherein
the two-dimensional material layer includes multiple layers of a single-layer two-dimensional crystal structure having a thickness T1; and
the total thickness TD of the two-dimensional material layer is a sum of each of the thicknesses T1 of the single-layer two-dimensional crystal structures.

11. The semiconductor device of claim 1, wherein a surface of the semiconductor layer contacting the two-dimensional material layer is surface-treated with monolayer atoms.

12. The semiconductor device of claim 1, wherein the metal layer includes a metal material and the semiconductor layer includes a semiconductor material, further comprising:
a mixture layer between the two-dimensional material layer and the metal layer, the mixture layer including the metal material and the semiconductor material.

13. The semiconductor device of claim 1, wherein each of the source region and the drain region has a doping concentration that is equal to or higher than $10^{19}/cm^3$.

14. The semiconductor device of claim 1, wherein a part of the source region directly contacts the source electrode.

* * * * *